United States Patent
Bonella et al.

(10) Patent No.: US 7,941,592 B2
(45) Date of Patent: May 10, 2011

(54) METHOD AND APPARATUS FOR HIGH RELIABILITY DATA STORAGE AND RETRIEVAL OPERATIONS IN MULTI-LEVEL FLASH CELLS

(76) Inventors: Randy M. Bonella, Portland, OR (US); Daniel J. Allen, Derry, NH (US); Thomas J. Holman, Portland, OR (US); Chung W. Lam, Hillsborough, CA (US); Hiroyuki Sakamoto, Ome (JP)

( * ) Notice: Subject to any disclaimer, the term of this patent is extended or adjusted under 35 U.S.C. 154(b) by 436 days.

(21) Appl. No.: 12/228,795

(22) Filed: Aug. 14, 2008

(65) Prior Publication Data
US 2010/0042772 A1 Feb. 18, 2010

(51) Int. Cl.
*G06F 12/00* (2006.01)
(52) U.S. Cl. .................. 711/103; 711/170; 365/185.03; 365/185.18
(58) Field of Classification Search .................. 711/103, 711/170; 365/185.03, 185.18
See application file for complete search history.

(56) References Cited

U.S. PATENT DOCUMENTS

| | | | |
|---|---|---|---|
| 7,545,673 B2* | 6/2009 | Lasser | 365/185.03 |
| 7,568,135 B2* | 7/2009 | Cornwell et al. | 714/721 |
| 7,773,420 B2* | 8/2010 | Kim | 365/185.08 |
| 2008/0175059 A1* | 7/2008 | Kim et al. | 365/185.12 |

* cited by examiner

*Primary Examiner* — Stephen C Elmore

(57) ABSTRACT

One or more multi-level NAND flash cells are operated so as to store only single-level data, and these operations achieve an increased level of charge separation between the data states of the single-level operation by requiring a write to both the upper and lower pages, even though only one bit of data is being stored. That is, the second write operation increases the difference in floating gate charge between the erased state and the programmed state of the first write operation without changing the data in the flash memory cell. In one embodiment, a controller instructs the flash memory to perform two write operations for storing a single bit of data in an MLC flash cell. In another embodiment, the flash memory recognizes that a single write operation is directed a high reliability memory area and internally generates the required plurality of programming steps to place at least a predetermined amount of charge on the specified floating gate.

15 Claims, 9 Drawing Sheets

US 7,941,592 B2

METHOD AND APPARATUS FOR HIGH RELIABILITY DATA STORAGE AND RETRIEVAL OPERATIONS IN MULTI-LEVEL FLASH CELLS

FIELD OF THE INVENTION

The present invention relates generally to non-volatile memory, and more particularly relates to high reliability data storage and retrieval operations in multi-level flash memory cells. The present invention further relates to operation of multi-level flash cells in devices of the NAND architecture.

BACKGROUND

Advances in semiconductor manufacturing technology have resulted in, among other things, reducing the cost of sophisticated electronics to such an extent that integrated circuits have become widely incorporated in modern consumer electronics products. Such consumer electronics products include, but are not limited to, mobile phones, MP3 music players, personal computers, data storage devices, and portable navigation systems. It is known that the utility of many such consumer electronic products is increased when the non-volatile data storage capacity of these products is increased.

One of the key enablers of such advanced consumer electronic products, has been the improvements and advancements in non-volatile memory storage devices. In particular, the data storage capacity, i.e., the amount of data that can be stored, of flash memory devices has increased dramatically with the continued reduction in the physical size of transistors and interconnects. Further significant advances in non-volatile memory storage capacity have been achieved by the introduction of the NAND flash architecture. Recently, even further advances in non-volatile memory storage capacity have been achieved through the use of multi-level flash memory cell technology. A multi-level flash memory cell is a single field effect transistor structure with a floating gate, and associated write and read circuitry operable, respectively, to program at least four states, rather than the two states of a conventional flash memory cell, so that at least two bits worth of data may be stored and retrieved from a single flash memory cell.

Unfortunately, because the operating voltage range of the multi-level cell flash memory devices remains the same as the operating voltage range of single-level cell flash memory devices, the floating gate charge separation, and corresponding threshold voltage separation, between adjacent states in a multi-level flash memory cell are decreased as compared to the separation between states in a single-level flash memory cell. Since the margin of state separation is decreased in multi-level flash memory cells, the susceptibility to various error mechanisms is correspondingly increased, and must be dealt with by additional circuitry.

What is needed are methods of, and apparatus for, operating at least portions of a flash memory device, such as a multi-level cell NAND flash memory device, so as to reduce susceptibility to data decay and read disturb errors.

SUMMARY OF THE INVENTION

Briefly, one or more multilevel NAND flash cells are operated so as to store only single-level data, and these operations achieve an increased level of charge separation between the data states of the single-level operation by requiring a write to both the upper and lower pages, even though only one bit of data is being stored. That is, the second write operation increases the difference in floating gate charge between the erased state and the programmed state of the first write operation without changing the data in the flash memory cell. In one embodiment, a controller instructs the flash memory to perform two write operations for storing a single bit of data in a multi-level flash memory cell. In another embodiment, the flash memory recognizes that a single write operation is directed a high reliability memory area and internally generates the required plurality of programming steps to place at least a predetermined amount of charge on the specified floating gate.

In one aspect of the present invention, single-bit storage in a multi-level flash memory cell provides greater reliability, data integrity, and resistance to error mechanisms than can be achieved for single-bit storage in a single-level flash memory cell.

DETAILED DESCRIPTION

Figure 1:
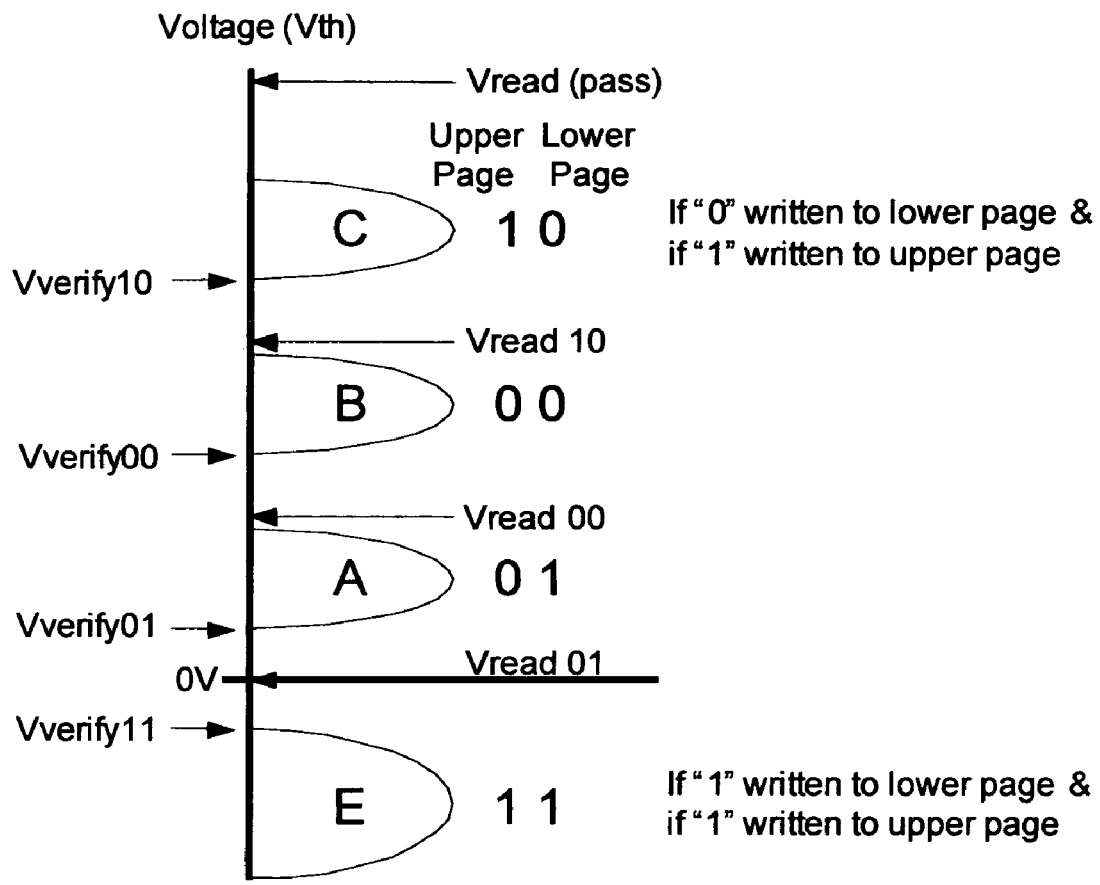
FIG. 1 is a diagram showing the field effect transistor threshold voltage ranges that correspond to each of four different states in a multi-level flash cell, and further show the bit patterns associated with each of those states.

Generally, in accordance with the present invention, a portion of an MLC NAND flash array is operated wherein each flash memory cell in that portion is only required to store one bit of information, rather than two or more. Further, in accordance with the present invention, both an upper page write operation and a lower page write operation are performed, even though only one bit of information is being stored, so that the amount of threshold voltage separation is as great as possible between the "0" state and the "1" state. In other words, the second write operation increases the difference in floating gate charge between the erased state and the programmed state of the first write operation without changing the data in the flash memory cell.

Various embodiments of the present invention provide the ability to use a multi-level flash memory cell for single-bit storage such that there is greater reliability, data integrity, and resistance to error mechanisms than can be achieved for single-bit storage in a single-level flash memory cell.

Reference herein to "one embodiment", "an embodiment", or similar formulations, means that a particular feature, structure, operation, or characteristic described in connection with the embodiment, is included in at least one embodiment of the present invention. Thus, the appearances of such phrases or formulations herein are not necessarily all referring to the same embodiment. Furthermore, various particular features, structures, operations, or characteristics may be combined in any suitable manner in one or more embodiments.

Terminology

The terms chip, integrated circuit, semiconductor device, and microelectronic device are sometimes used interchangeably in this field. The present disclosure uses these terms as they are commonly understood in the field.

FET, as used herein, refers to metal-oxide-semiconductor field effect transistors (MOSFETs). These transistors are also known as insulated gate field effect transistors (IGFETs).

Flash refers to a type of non-volatile memory in which charge is stored on a floating electrode disposed between a FET gate electrode (sometimes referred to as the control gate) and the surface of a semiconductor, the floating electrode being surrounded by dielectric material. In the field of flash memory, this floating electrode is commonly referred to as a floating gate. It will be appreciated by those skilled in the art, that by increasing or decreasing the amount of charge stored on the floating gate, the effective threshold voltage of the FET structure is changed. For example, adding electrons to the floating gate makes the threshold voltage of an N-channel FET structure of a flash memory cell more positive, whereas removing electrons from the floating gate makes the threshold voltage less positive (and depending on various process parameters this threshold voltage could be negative). The FET structure with the floating gate, as described above, is referred to herein as a flash memory cell.

Flash memory device, as used herein, refers to an integrated circuit having a plurality of flash memory cells organized in an array, and further including circuitry for addressing, erasing, writing and reading the plurality of flash memory cells. Such flash memory devices commonly have error detection and correction circuitry as well.

BLC is an acronym for Binary Level Cell, and refers to a flash memory cell that is operable to be programmed and read, such that there are two distinctly detectable states represented by the amount of charge on the floating gate of the flash memory cell, thereby representing one bit of data.

SLC is an acronym for Single Level Cell, and refers to a flash memory cell that is operable to be programmed and read, such that there are two distinctly detectable states represented by the amount of charge on the floating gate of the flash memory cell, thereby representing one bit of data. The expression single level cell distinguishes a flash memory cell storing one bit of information from a multi-level cell which stores more than one bit of information. As used herein SLC and BLC are two different expressions that each refer to the same thing, that is, a flash memory cell that stores only one bit of data.

MLC is an acronym for Multi-Level Cell, and refers to a flash memory cell that is operable to be programmed and read, such that the number of distinctly detectable states represented by the amount of charge on the floating gate of the flash memory cell is great enough to represent at least two bits. For example, by storing and detecting four distinct charge ranges, a single flash memory cell may store two bits. Presently available MLC flash devices use four charge states to represent two bits, however the principles of the present invention are not limited to multi-level cell flash memories that store only two bits per cell.

SSLC is an acronym for Strong Single Level Cell, and refers to a method, in accordance with the present invention, in which a single bit of data is stored in a multi-level flash memory cell, by performing two write operations, or by performing multiple internal write and verify cycles until the single bit of data is driven to the charge state that is furthest from the erased state.

Program disturb error is an expression that, in connection with a flash memory cell, refers to an unintended change in the stored data when a write, or programming operation, on a first page, results in that unintended data change on an unrelated page. Program disturb errors are sometimes referred to as the over-program effect. Program disturb errors may occur in both single-level cell and multi-level cell flash memories.

Read disturb error is an expression that, in connection with a flash memory cell, refers to an unintended change in the data stored in a flash memory cell as a consequence of reading that flash memory cell.

Data decay, as used herein, is an expression that refers to changes in the data stored in a flash memory cell as consequence of changes in the amount of charge stored on the floating gate of the flash memory cell due to various leakage mechanisms.

SOC is an acronym for System On a Chip, and refers to an electronic system consisting of a number of circuit blocks all implemented on a single integrated circuit, and typically having those blocks interconnected amongst themselves. It is not uncommon for one or more of the blocks to be a memory block.

There is a need, in some semiconductor applications, to have a at least a portion of an MLC Flash memory be very robust, and as immune to errors as possible. By robust and immune to errors, it is meant that this designated portion of an MLC Flash memory has data retention times greater than other portions of the MLC Flash memory, and that this designated portion is also less prone to read disturb errors. A portion of the MLC Flash memory having such attributes is particularly useful for storing operating code, security codes, passwords, and configuration data. Various embodiments of the present invention utilize aspects of the MLC Flash architecture and configure at least a portion of the MLC Flash in such a way so as to provide, on a page basis, a very robust non-volatile storage area that is substantially less prone to data corruption, regardless of whether that corruption mechanism is a program disturb error, read disturb error, or data decay caused error.

Various embodiments of the present invention provide for writing the lower page locations with the application data, and then writing the associated upper page locations with all 1's. By writing all 1's in the upper page, the programmed MLC flash cells are forced to the two most extreme states of charge storage on the floating gate. By putting an MLC Flash cell into one of the two states, "E" or "C", as shown in FIG. 1, the MLC flash cell is made much less sensitive to read disturb errors and to general data decay over time. In typical embodiments of the present invention, these locations, i.e., MLC flash memory cells, are not erased or written very often, thus the wear on these cells is minimal.

The effect of putting the MLC device into states, "E" and "C", is to have created, in the MLC flash cells, very robust storage that is less prone to data corruption errors by any mechanism. It is noted that this is achieved at the expense of: 1) performing an upper page write operation; and 2) reducing memory capacity by not using the associated upper page for real data storage.

Since operation of an MLC Flash in accordance with the present invention results in the occurrence of errors being significantly reduced, the need to monitor these locations and to scrub the locations is correspondingly reduced. This saves system design complexity by not having to build in as much checking and redundancy, and saves cost by not having to support an auxiliary robust non-volatile storage device, such as a Serial NOR Flash device, in the system to provide this function.

Many applications that require robust storage, i.e., very reliable non-volatile but re-writable storage, use either SLC mode FLASH devices and/or will conventionally add a NOR Flash device known as a SPI (Serial Peripheral Interface) Flash device. These storage devices are very robust for loading operating code, security codes, passwords, and configuration data. Unfortunately, cost and complexity are added to a system by including support for such devices. Another option for a slightly more robust operational state is to write the lower page only. This provides more sense margin for the "0" state but does little for the stability of the "1" state or the erase state.

Various embodiments of the present invention create robust non-volatile storage pages in a given block of memory in an MLC NAND Flash memory device. These locations may be used for storing information such as, but not limited to, operating code, security codes, passwords, and configuration data for systems. Typically, these assigned locations would rarely be updated or changed. This is important as purposefully forcing the MLC NAND storage cells to the "C" state or "10" state causes extra wear on the device and is not intended for normal operational blocks or pages.

Basic Operation

Figure 2:
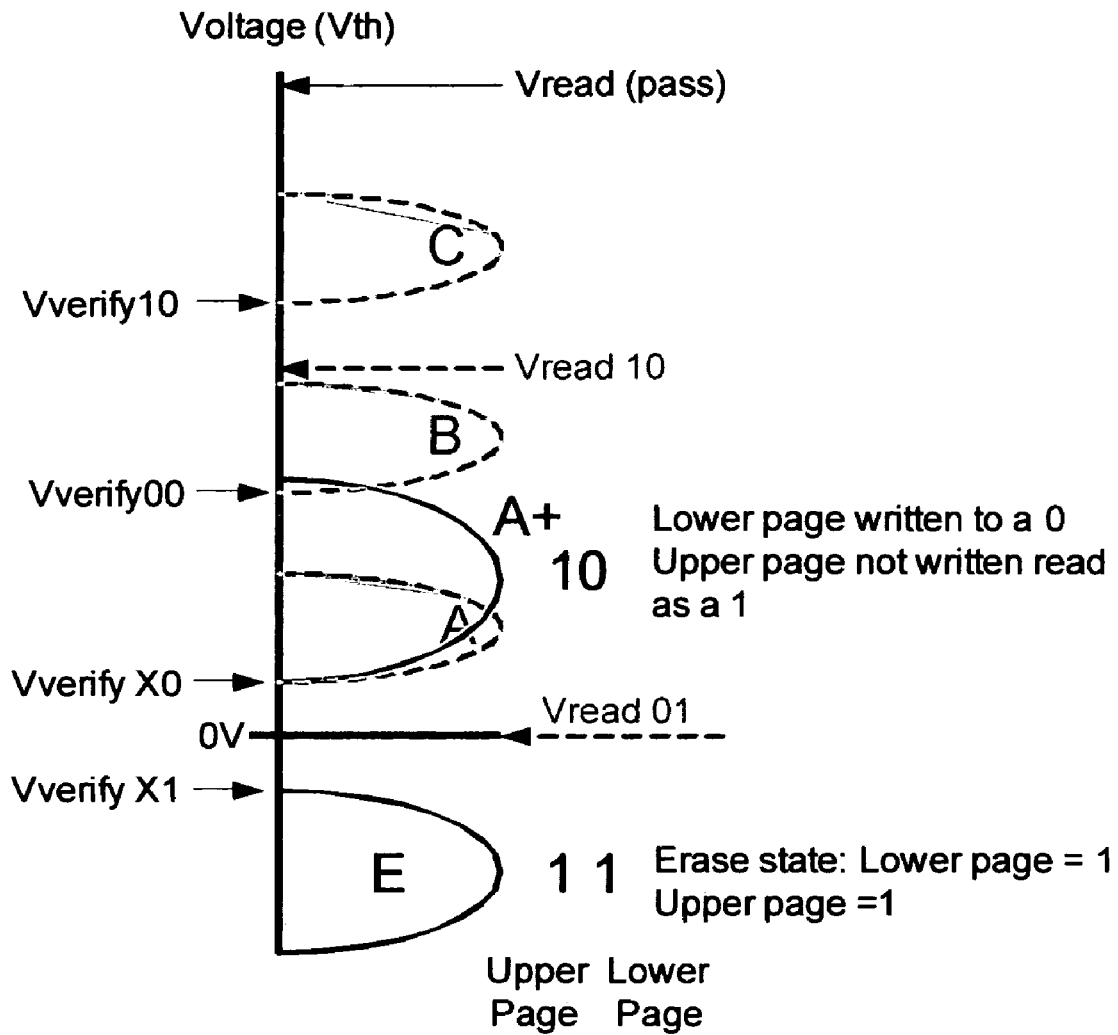
FIG. 2 is a diagram showing the field effect transistor threshold voltage ranges that correspond to an erased state and a first state after a lower page write and without an upper page write.
Figure 3:
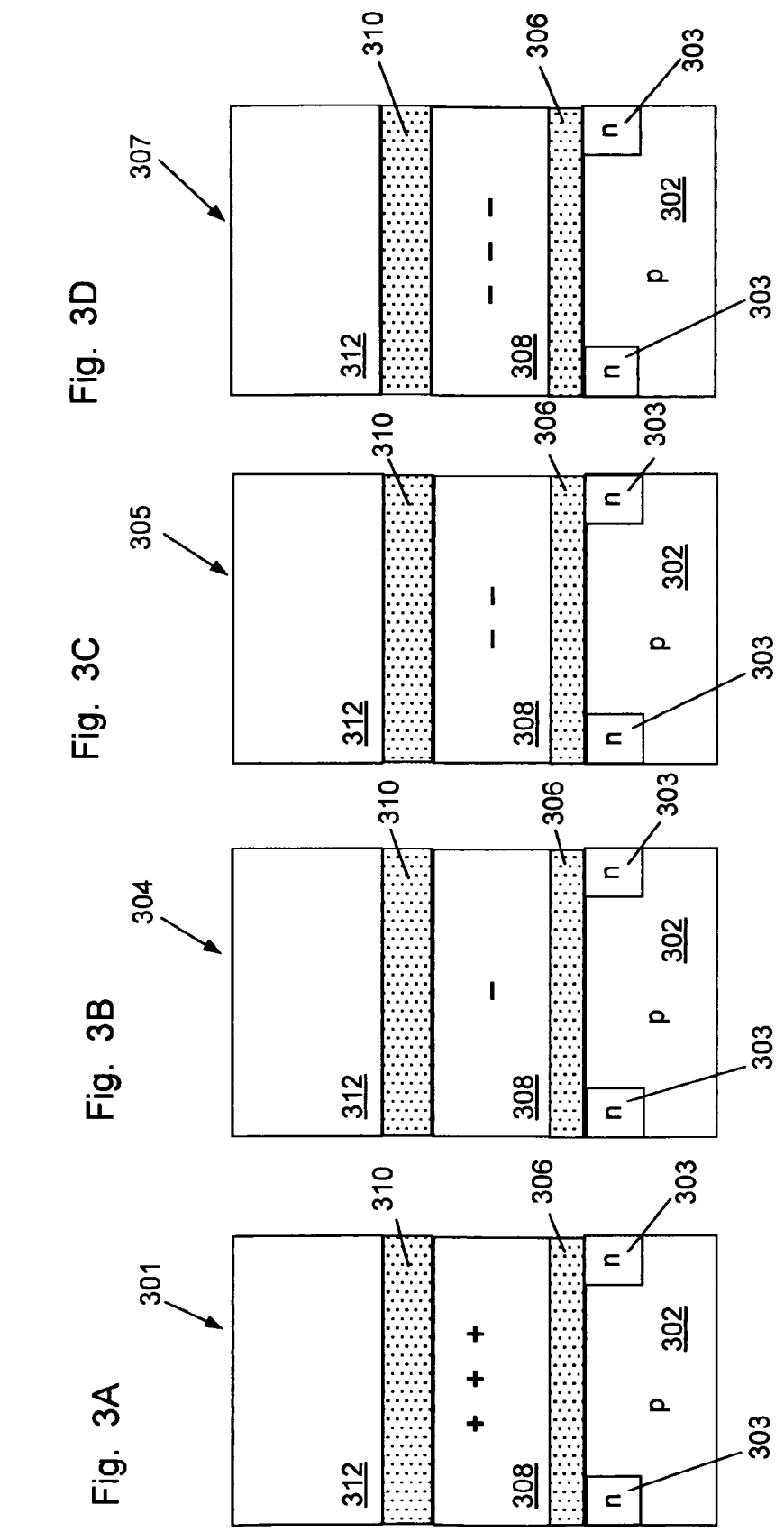
FIGS. 3A-3D are cross-sectional representations of a multi-level flash cell shown with different charge levels indicated on the floating gate. Those skilled in the art of semiconductor design and/or manufacturing will appreciate that these cross-sectional representations are not necessarily drawn to scale, but rather illustrate the functional relationship of the various illustrated layers.

Referring to FIGS. 1, 2, 3A, 3B, 3C and 3D, the physical and logical operation of multi-level flash memory cells are briefly described. More particularly, FIG. 1 shows four threshold voltage ranges and the logical bit patterns assigned to each of those four threshold voltage ranges. The erased state is assigned the two bit data value "11". Note that state C (two bit data value "10") is achieved, after an erase operation, by writing a "0" to the lower page and writing a "1" to the upper page. FIG. 2 shows the change in threshold voltage range in an illustrative multi-level flash memory cell from the erased state (E), to a state labelled A+, after the lower page was written with the data value "0", without any write to the upper page. Although the two bit data value assigned to state A+ is "10", it can be seen by comparison with state C of FIG. 1, which is also assigned the two bit data value "10", that there is a significantly greatly separation in threshold voltage range.

FIGS. 3A-3D show schematic cross-sectional representations of a flash memory cell with different amounts of electronic charge stored on the floating gates. More particularly, in FIG. 3A, an MLC flash cell 301 includes a p-type substrate 302, with n-type source/drain terminals 303 disposed in substrate 302, a first dielectric layer 306 disposed on substrate 302, an electrically conductive floating gate 308 disposed on first dielectric layer 306, a second dielectric layer 310 disposed on floating gate 308, and an electrically conductive control gate 312 disposed on second dielectric layer 310. The cross-sections of FIGS. 3A-3D are the same except for the charge on floating gate 308. The charge level of floating gate 308 in flash cell 301 is the most positive (least negative) and represents the erased state in FIG. 1. The charge level of floating gate 308 in flash cell 304 is more negative than the erased state and represents state A in FIG. 1. The charge level of floating gate 308 in flash cell 305 is more negative than state A, and represents state B. The charge level of floating gate 308 in flash cell 307 is more negative than state B, and represents state C.

As noted above, a flash memory works by determining the amount of charge that has been stored on the floating gate of a flash memory cell. Since the amount of charge on the floating gate directly affects the threshold voltage, Vt, of the flash memory cell, and the Vt directly affects the current between the source and drain terminals of the flash cell for a given voltage applied to the select gate, it is possible to determine the amount of charge on the floating gate by detecting the amount of current through the flash cell under on one or more sets of voltages applied to the control gate, drain and source of a flash memory cell.

For a flash memory cell that stores only one bit of data it is necessary to be able to distinguish between two states. A first one of those two states is assigned to be a logical zero, and a second one of those two states is assigned to be a logical one.

In the illustrative embodiments of the present invention, the MLC NAND Flash device stores two bits per storage location. This is accomplished by storing, and recognizing, several different amounts of charge in a cell. The logical states associated with four different charge levels in the two-bit cell arrangement of illustrative embodiments of the present invention are shown in FIG. 1 as state "E" (erased or "11"), state "A" ("01"), state "B" ("00"), and state "C" ("10"). The bits are split between pages, with a first bit mapped to an upper page, and a second bit mapped to an associated lower page. Writes to different pages are required in order to utilize all four states of the illustrative MLC flash cell. It is noted that, although the ability to detect which state the flash memory cell is in depends on the amount of charge stored on the floating gate, the logical labelling of those states, that is assigning logical ones and zeroes to the various states, is not necessarily a measure of charge storage. In other words, each of the four recognized charge ranges corresponds to a predetermined bit pattern that is selected by the designer of the flash memory device.

After an erase cycle, an MLC NAND flash cell, also referred to as a storage location, is set to state "E". If a "1" is written to the lower page, then the storage location stays in state "E". If a "0" is written to the lower page, then the storage location is moved to an A+ state, that is, someplace between state "A" and state "B" as shown in FIG. 2. Now, if the lower page is written as a "1" thus remaining in state "E" and then the upper page is written as a "0", then the state is changed to State "A", "01". If the lower page was written as a "0" which had put it in "A+" state and the upper page is written as a "0" then the storage voltage is moved to state "B" or the "00" state. If the lower page was written as a "0" and is in the "A+" state and if a "1" is written to the upper page then the storage location changes from state "A+" to state "C" (i.e., "10" state).

It is important to note that of these state positions, state "E" and state "C" for the lower page exhibit nonvolatile storage properties as good as, if not better than, those properties of SLC NAND Flash storage devices. No state on the upper page exhibits this same quality of storage in this configuration. If the storage cell is in state "E", then a common mode of failure in this storage cell is for the data stored therein to appear as something other than the assigned digital value of 11. Such a failure may result from an undesired presence of electrons (whether by injection, tunneling, read disturb, or other mechanism) on the floating gate. This charge presence on the floating gate essentially moves the storage cell from state "E" toward state "A". However, as the lower page remains a "1" in either the "E" state or the "A" state, any changes to the stored value have a long way to transition prior to a failure being recognized. Similarly, if the lower page is a "0" and is in the "C" state any read disturb or cell storage decay is blunted because the lower page remains a "0" in either the "C" state or the "B" state. Protection is unique to the lower page in either the "E" state as a "1" or in the "C" state as a "0". The only way to achieve these two states is to selectively program the lower page with real data and the associated upper page with all 1's. This forces every storage cell in the page to be either in the "E" state "11" or in the "C" state "10".

If the lower page is put in the "A" state, it is then susceptible to read disturb and may fail towards the "B" state. If the lower page is left in the "B" state it is then susceptible to failure caused by leakage or cell wear and will fail to the "A" state. The upper page, regardless of which state it is in, is susceptible to failure by both read disturb or leakage/wear events. In all state values, the upper page would have a fail tendency towards another state. State "E" fails towards state "A", State "A" fails towards state "E". State "B" fails towards state "C" and state "C" fails towards state "B".

Figure 10:
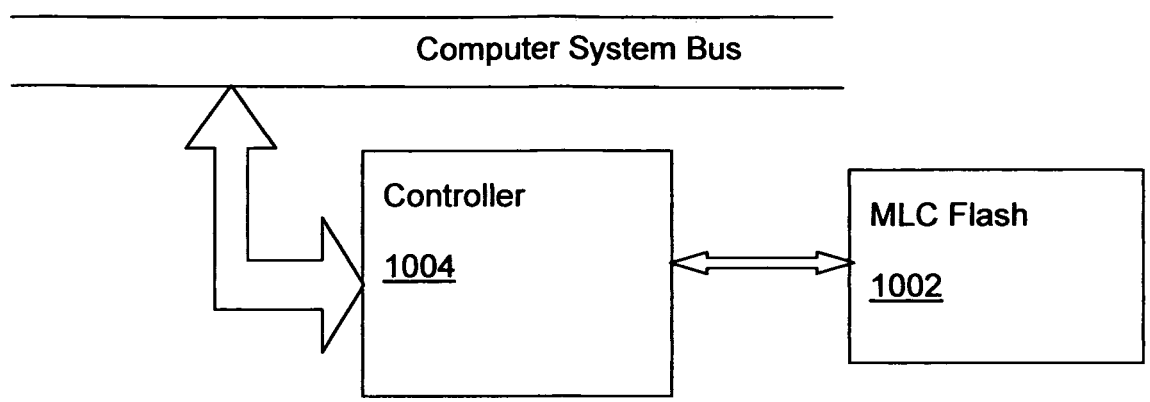
FIG. 10 is an illustrative high-level block diagram showing the connections between an MLC flash memory device, a controller external to the MLC flash memory device, and a computer system bus.

Two illustrative embodiments of the present invention are further described below. In a first embodiment, a controller coupled to the flash memory device provides the commands, addresses, and data, to achieve single bit storage in a multi-level flash cell. This embodiment is referred to as controller mode operation. FIG. 10 shows an MLC flash memory device 1002 coupled to a controller 1004, with controller 1004 coupled to a computer system bus. The MLC flash memory device can be, for example, a NAND flash semiconductor memory having a capacity equal to or greater than 16 Gb (giga-bit) when implemented with semiconductor process technology, or design rules, of 60 nm process technology node. In such a NAND flash memory device, one physical row of memory cells is assigned to two physical addresses (i.e., upper and lower pages). For fast access, the NAND flash memory device may have a double data rate (DDR) interface or a low voltage differential signal (LVDS) interface, to receive and/or output data. In a second embodiment, circuitry within the NAND flash memory device recognizes that a write command is for a particular address block and automatically generates the internal programming operations to go from state E to state C. This embodiment is referred to as Auto-Flash Mode.

Controller Mode

In the illustrative embodiments of the present invention described herein, the flash memory device is of the NAND architecture. However, those skilled in the art and having the benefit of this disclosure will appreciate that the present invention is applicable to multi-level flash cells in a NOR architecture flash memory device as well.

Figure 4:
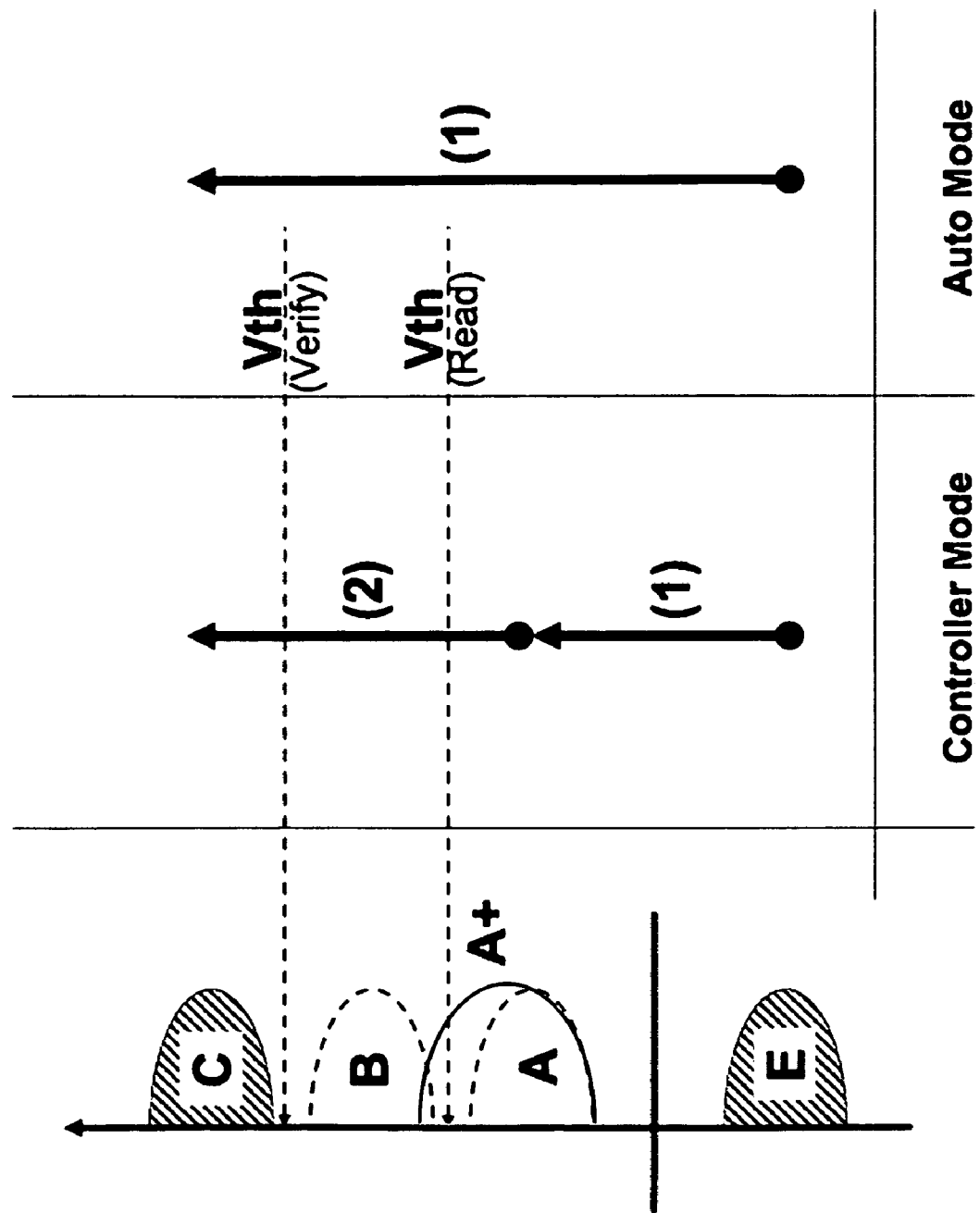
FIG. 4 is a diagram showing the field effect transistor threshold voltage ranges corresponding to each of four different states and further showing both a two-step operation for transition between the two states representing the greatest difference in threshold voltage range, and a one-step operation for transition between the two states representing the greatest difference in threshold voltage range.

In this mode, as shown in FIG. 4, programming to state "C" basically involves two steps. If "0" is to be written to a lower page within a particular block address range, a controller coupled to the flash memory device provides that flash memory device with a command, an address for such lower page, and "0" data to the flash memory device so that the threshold level shift, induced by the change in charge of the floating gate of the storage cell, is manifested as a change from state E to state A+. Although this is the first step, it typically involves multiple program-and-verify steps within the MLC NAND Flash memory device. Subsequently, the illustrative flash memory device is provided with a command, an address for an upper page sharing the same word line with the lower page, and "1" data so that the threshold level shift achieved thereby, moves the storage cell from state A+ to state C. This second step also typically involves multiple program-and-verify steps. The controller has either a circuit or firmware to determine if an address for a lower page is within a particular block address range. To read data stored in the lower page, the threshold level between B and A is used.

Auto-Flash Mode

Referring to FIG. 4, in auto-flash mode, programming to state C basically involves just one step. (Although this one step also involves multiple program-and-verify state operations internal to the flash memory device.) If "0" is to be written to a lower page within a particular block address range, the controller coupled to the flash memory device provides a command, an address for such lower page, and "0" data to the flash memory device.

Block Management

Figure 5:
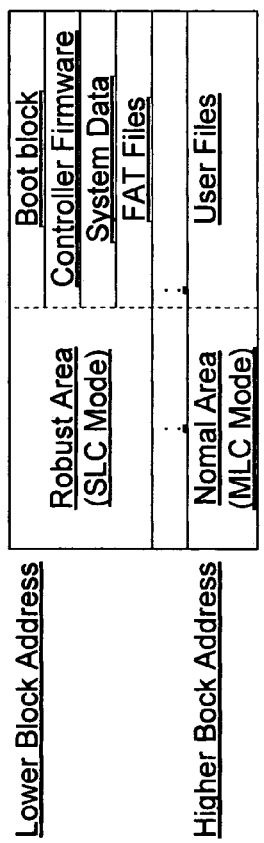
FIG. 5 is a block diagram representation of the memory layout of an MLC flash memory in accordance with the present invention.
Figure 6:
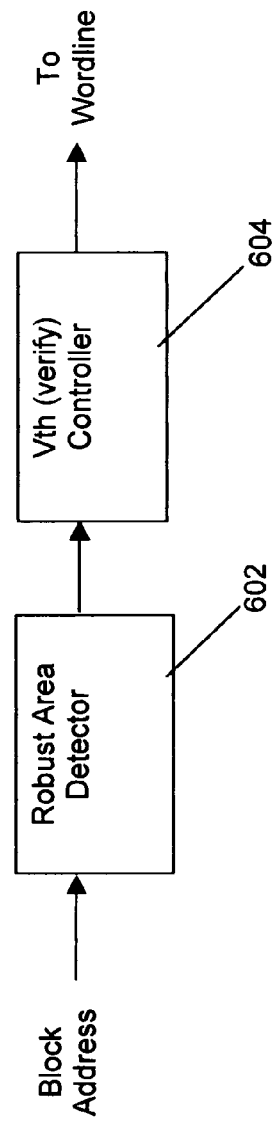
FIG. 6 is a schematic block diagram of circuitry for operating a portion of an MLC flash in accordance with the present invention, and more particularly for determining whether a block address is within an area designated for robust, i.e., strong SLC, data storage.

Referring to FIGS. 5 and 6, a block management arrangement, in accordance with present invention is described. In order to provide a larger storage capacity with the MLC flash memory device, some areas of the memory space can be managed in SLC mode while other areas of the memory space are managed in MLC mode. For example, as shown in FIG. 5, the memory space with relatively lower logical block addresses are identified as the "Robust Area", and are managed in SLC mode. This robust storage is desired for information such as, but not limited to, boot block information, controller firmware program, system data for controller and/or FAT files. On the other hand, the memory space with relatively higher logical block addresses is identified as the "Normal Area", and is managed in MLC mode. The Normal Area usually includes user file information. Since the data for only one logical page (for example, lower page) is used, in SLC mode, to store the data in the MLC flash memory device, one logical block corresponds to two physical blocks in the MLC flash memory device. In MLC mode, one logical block corresponds to one physical block. In view of the foregoing, it can be seen that the logical-to-physical address translation in SLC mode is different from that in MLC mode.

The Robust Area can be, for example, 10% or less of the entire memory space. For example, if the entire memory space provided by one or more NAND flash semiconductor memory devices is 16 Gb (giga-bit), then a memory space of approximately 1.6 Gb can be allocated to the Robust Area. It will be appreciated that the present invention is not limited to any particular percentage allocation of memory space between the Robust and Normal areas.

FIG. 6 illustrates a mechanism for distinguishing between the Robust Area and the Normal area. The flash memory device includes a circuit 602 to determine if an address for a lower page is within a particular block address range. If the address received is within that particular block address, then a threshold voltage controller 604 in the flash memory device changes its threshold voltage level for verify read to a level between B and C states. During the program-and-verify steps, the level will be shifted to E to C. To read data stored in the lower page, the threshold level between B and A is used.

One advantage of auto-flash mode is that less power is required for accomplishing a strong single level cell (SSLC)

write operation than is possible in the Controller Mode (described above). In Auto-Flash Mode, both the controller and flash memory device have less to do, at least in terms of moving data, transmitting and receiving commands, and setting up programming voltages.

Illustrative Methods

Figure 7:
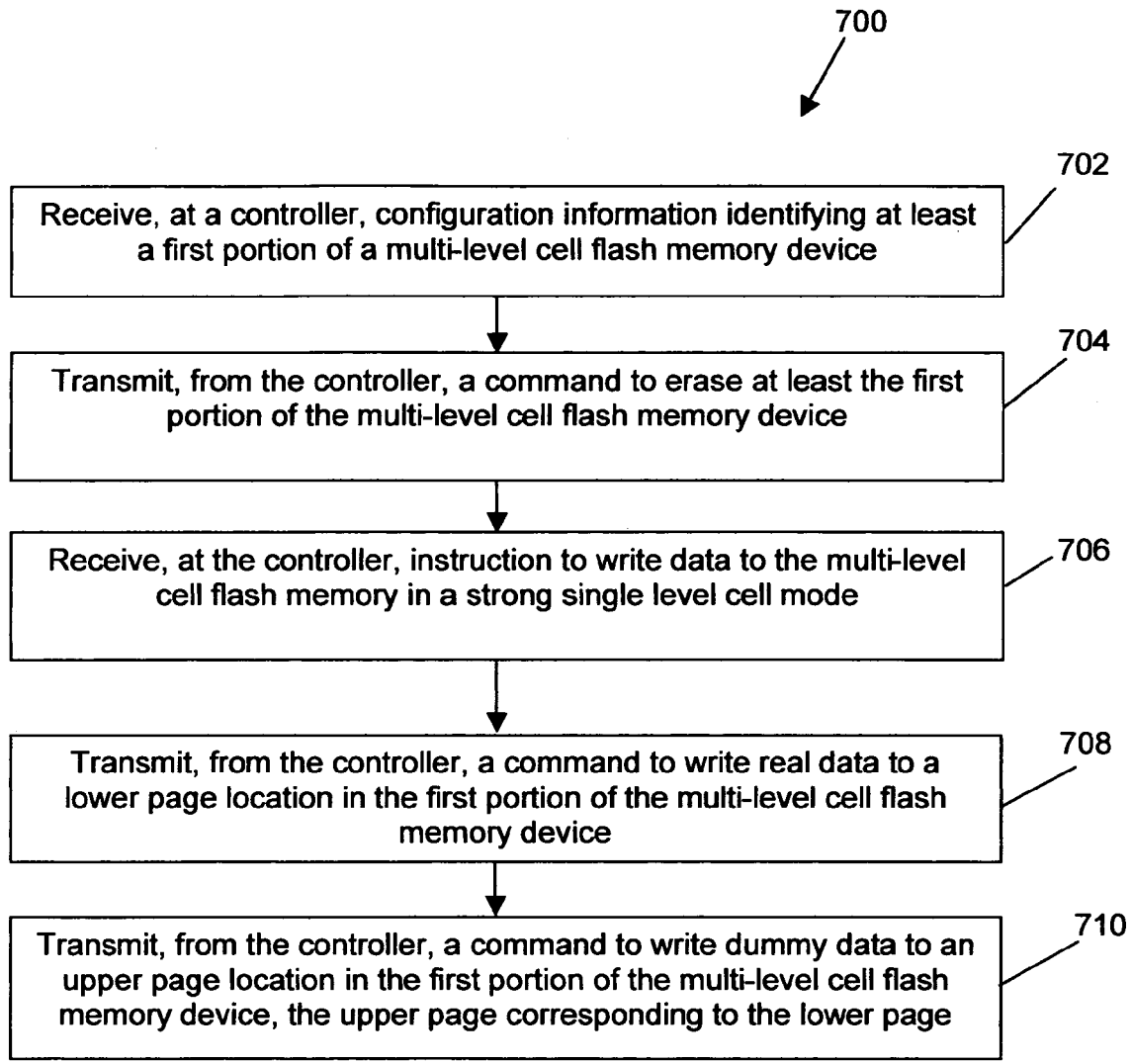
FIG. 7 is a flow diagram of process for using a multi-level flash cell as a single-level flash cell in accordance with the present invention from the point of view of a controller coupled to an MLC flash memory device.

Referring to FIG. 7, a method 700 in accordance with the present invention is presented in which a controller, electrically coupled to a multi-level flash memory device, receives commands from various external system components, and responsive thereto, generates, and transmits various commands and data packets to the coupled multi-level flash memory device. More particularly, method 700 includes receiving 702, at a controller, configuration information identifying at least a first portion of a multi-level cell flash memory device; transmitting 704, from the controller, a command to erase at least the first portion of the multi-level cell flash memory device; receiving 706, at the controller, an instruction to write data to the multi-level cell flash memory in a strong single level cell mode; transmitting 708, from the controller, a command to write real data to a lower page location in the first portion of the multi-level cell flash memory device; and transmitting 710, from the controller, a command to write dummy data to an upper page location in the first portion of the multi-level cell flash memory device, the upper page corresponding to the lower page. In this illustrative embodiment, the first portion identified by the configuration information is an area of the MLC flash memory device set aside, i.e., designated for strong SLC data storage. It will be appreciated that the aforementioned external system components may be, but are not limited to, a microprocessor coupled to the controller by way of a bus (e.g., a computer system bus); or a SPI Flash device directly coupled to the controller.

In an alternative arrangement, an MLC flash memory device may have one or more pre-defined memory areas set aside for strong SLC data storage, and in such an alternative arrangement, there is no need to receive the configuration information from an external source since it is known and fixed in advance by the manufacturer during the manufacturing process. Manufacturing and circuit techniques for providing non-volatile configuration information in an integrated circuit are well-known in the art and are not further described herein.

Figure 8:
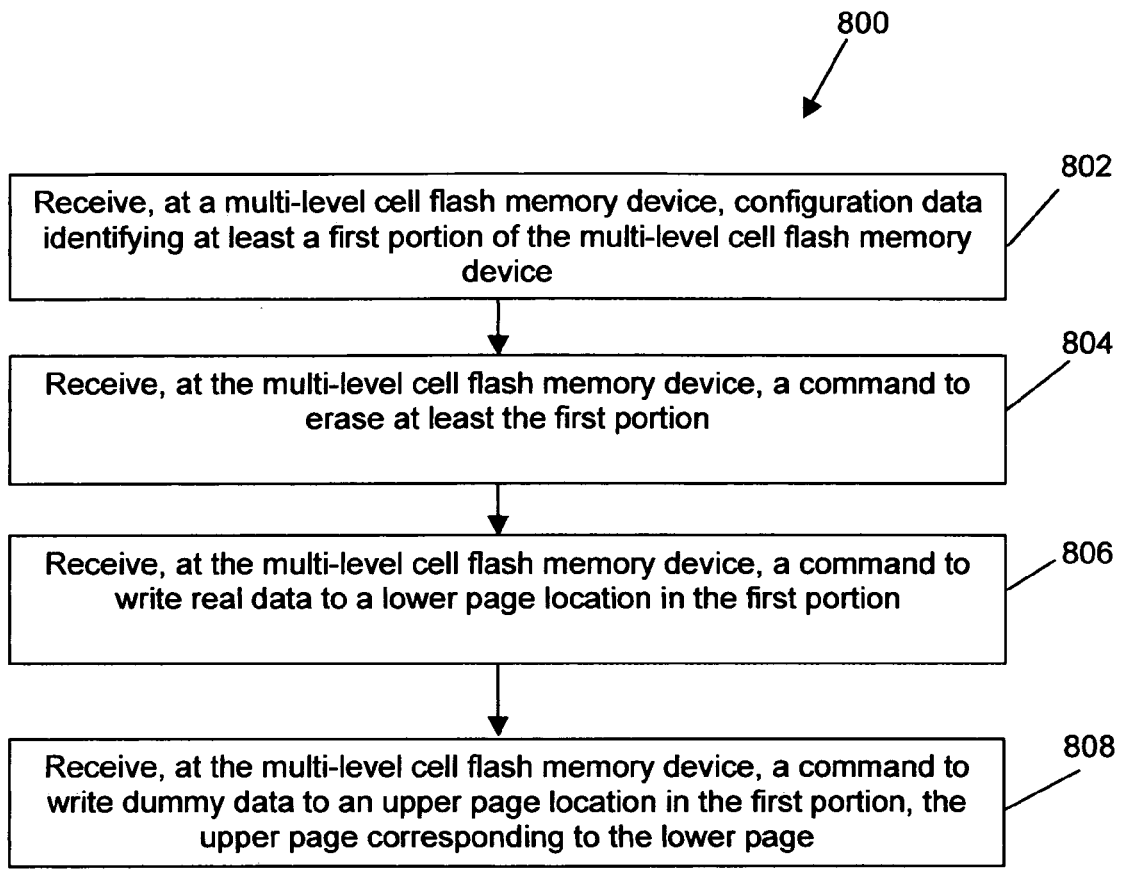
FIG. 8 is a flow diagram of process for using a multi-level flash cell as a single-level flash cell in accordance with the present invention from the point of view of an MLC flash memory device.

Referring to FIG. 8, a method 800 in accordance with the present invention is presented in which a multi-level cell flash memory device receives various commands, including those needed to perform a strong SLC data storage operation. More particularly, method 800 includes receiving 802, at a multi-level cell flash memory device, configuration data identifying at least a first portion of the multi-level cell flash memory device; receiving 804, at the multi-level cell flash memory device, a command to erase at least the first portion; receiving 806, at the multi-level cell flash memory device, a command to write real data to a lower page location in the first portion; and receiving 808, at the multilevel cell flash memory device, a command to write dummy data to an upper page location in the first portion, the upper page corresponding to the lower page.

Figure 9:
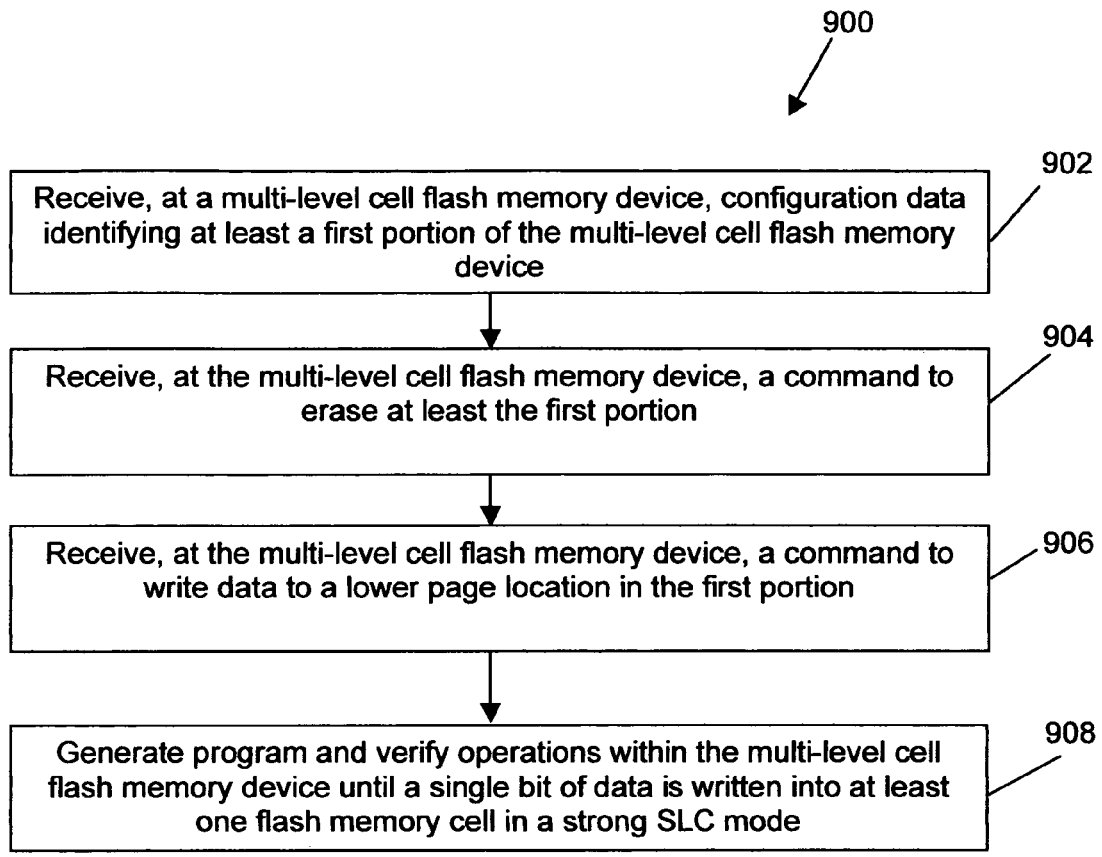
FIG. 9 is a flow diagram of process for using a multi-level flash cell as a single-level flash cell in auto-flash mode in accordance with the present invention.

Referring to FIG. 9, a method 900 in accordance with the present invention is presented in which a write command to a multilevel flash memory device is treated, because of the address of the write operation, as a strong SLC write, and circuitry internal to the flash memory device operates to provide program and verify operations until a single bit of data is stored in at least one flash memory cell as lower page data with the difference in floating gate charge between the erased and single bit programmed states being the equivalent of two write operations to the at least one flash memory cell. This method is referred to in this disclosure as Auto-Flash Mode. More particularly, method 900 includes receiving 902, at a multi-level cell flash memory device, configuration data identifying at least a first portion of the multi-level cell flash memory device; receiving 904, at the multi-level cell flash memory device, a command to erase at least the first portion; receiving 906, at the multi-level cell flash memory device, a command to write data to a lower page location in the first portion; and generating 908 program and verify operations within the multi-level cell flash memory device until a single bit of data is written into at least one flash memory cell in a strong SLC mode.

Benefit of New Method

In normal operation and with normal operational states with write/erase cycles <100 then read disturb cycles would be about 100,000 cycles. As the NAND flash ages and write/erase cycles are at 10,000 cycles then read disturb cycles likewise would be at 10,000 cycles prior to causing failures. If the lower page only is used (i.e. conventional SLC mode), then the operational behavior with write/erase cycles <100 cycles, results in read disturb cycles being 3,000,000 cycles Similarly, with write/erase cycles at 10,000 cycles then read disturb cycles would be 30,000 cycles. However, in an illustrative operational method in accordance with the present invention, using only the lower page for data and writing 1's to the upper page, then write/erase cycles <100 results in read disturb cycles being 30,000,000 cycles; and with write/erase cycles at 10,000 cycles, read disturb cycles would be 300,000 cycles.

CONCLUSION

The exemplary methods and apparatus illustrated and described herein find application in the field of non-volatile memory.

One advantage of the present invention is the ability to use a multi-level flash memory cell for single-bit storage such that there is greater reliability, data integrity, and resistance to error mechanisms than can be achieved for single-bit storage in a single-level flash memory cell.

It is to be understood that the present invention is not limited to the embodiments described above, but encompasses any and all embodiments within the scope of the subjoined Claims and their equivalents.

What is claimed is:

1. A method of operating a controller coupled to a multi-level flash memory device, comprising:
   receiving, at the controller, configuration information identifying at least a first portion of the multi-level cell flash memory device;
   transmitting, from the controller, a command to erase at least the first portion of the multi-level cell flash memory device;
   receiving, at the controller, an instruction to write data to the multi-level cell flash memory in a strong single level cell mode;
   transmitting, from the controller, a command to write real data to a lower page location in the first portion of the multi-level cell flash memory device; and
   transmitting, from the controller, a command to write dummy data to an upper page location in the first portion of the multi-level cell flash memory device, the upper page corresponding to the lower page.

2. The method of claim 1, wherein the multi-level flash memory device is organized as a NAND architecture.

3. The method of claim 1, wherein the multi-level flash memory device is organized as a NOR architecture.

4. The method of claim 1, wherein the controller receives the configuration information from a second flash memory device coupled thereto.

5. The method of claim 1, wherein the controller receives the configuration information from a computer system bus.

6. A method of operating a multi-level cell flash memory device, comprising:
- receiving, at the multi-level cell flash memory device, configuration data identifying at least a first portion of the multi-level cell flash memory device;
- receiving, at the multi-level cell flash memory device, a command to erase at least the first portion;
- receiving, at the multi-level cell flash memory device, a command to write real data to a lower page location in the first portion; and
- receiving, at the multi-level cell flash memory device, a command to write dummy data to an upper page location in the first portion, the upper page corresponding to the lower page.

7. The method of claim 6, wherein the multi-level flash memory device is organized as a NAND architecture.

8. The method of claim 6, wherein the multi-level flash memory device is organized as a NAND architecture.

9. The method of claim 6, wherein the at least first portion of the multi-level cell flash memory device is configured such that writes to that portion are performed as strong SLC writes.

10. A method of operating a multi-level cell flash memory device, comprising:
- receiving, at a multi-level cell flash memory device, configuration data identifying at least a first portion of the multi-level cell flash memory device;
- receiving, at the multi-level cell flash memory device, a command to erase at least the first portion;
- receiving, at the multi-level cell flash memory device, a command to write data to a lower page location in the first portion; and
- generating program and verify operations within the multilevel cell flash memory device until a single bit of data is written into at least one flash memory cell in a strong SLC mode.

11. The method of claim 10, wherein the multi-level flash memory device is organized as a NAND architecture.

12. The method of claim 10, wherein the multi-level flash memory device is organized as a NOR architecture.

13. The method of claim 10, wherein the first portion is designated for strong SLC data storage.

14. The method of claim 10, wherein receiving, at a multi-level cell flash memory device, configuration data identifying at least a first portion of the multi-level cell flash memory device comprises receiving the configuration data from a controller coupled to the multi-level cell flash memory device.

15. The method of claim 10, wherein receiving, at a multi-level cell flash memory device, configuration data identifying at least a first portion of the multi-level cell flash memory device comprises receiving the configuration data from the manufacturing process that forms the multi-level flash memory device.

* * * * *